United States Patent
Iwatani et al.

(10) Patent No.: US 6,642,882 B2
(45) Date of Patent: Nov. 4, 2003

(54) MIXER, RADAR MODULE, AND COMMUNICATION APPARATUS INCORPORATING THE SAME

(75) Inventors: Hidetoshi Iwatani, Kyoto-fu (JP); Sadao Yamashita, Kyoto-fu (JP)

(73) Assignee: Murata Manufacturing Co., Ltd (JP)

( * ) Notice: Subject to any disclaimer, the term of this patent is extended or adjusted under 35 U.S.C. 154(b) by 0 days.

(21) Appl. No.: 10/003,648

(22) Filed: Nov. 2, 2001

(65) Prior Publication Data

US 2002/0084932 A1 Jul. 4, 2002

(30) Foreign Application Priority Data

Nov. 17, 2000 (JP) .......................... 2000-350879

(51) Int. Cl.[7] .............. G01S 7/03; G01S 13/00
(52) U.S. Cl. ................ 342/175; 342/82; 342/89; 342/189; 342/194; 327/355; 327/356; 455/313; 455/323
(58) Field of Search .................. 455/313, 323, 455/324, 325, 326; 327/355–361; 342/21, 27, 28, 175, 189, 194, 51, 82–103; 343/700 MS, 702

(56) References Cited

U.S. PATENT DOCUMENTS

| | | | | |
|---|---|---|---|---|
| 4,068,232 A | * | 1/1978 | Meyers et al. ........... | 342/51 |
| 4,211,977 A | * | 7/1980 | Shinkawa et al. ........ | 455/326 |
| 4,215,313 A | * | 7/1980 | Chang et al. ............. | 455/326 |
| 4,461,039 A | * | 7/1984 | Hersman .................. | 455/326 |
| 4,656,478 A | * | 4/1987 | Leuenberger ............ | 342/51 |
| 5,119,099 A | * | 6/1992 | Haruyama et al. ....... | 342/51 |
| 5,142,697 A | * | 8/1992 | Podvin .................... | 455/326 |
| 5,311,186 A | * | 5/1994 | Utsu et al. ............... | 342/51 |
| 5,517,195 A | * | 5/1996 | Narlow et al. ........... | 342/51 |
| 6,052,087 A | * | 4/2000 | Ishikawa et al. ......... | 343/700 MS |
| 6,414,639 B1 | * | 7/2002 | Iio ........................... | 343/702 |
| 6,456,228 B1 | * | 9/2002 | Granhed et al. ......... | 342/51 |

FOREIGN PATENT DOCUMENTS

JP     10-075109     3/1998

\* cited by examiner

*Primary Examiner*—Bernarr E. Gregory
(74) *Attorney, Agent, or Firm*—Dickstein, Shapiro, Morin & Oshinsky, LLP.

(57) ABSTRACT

A mixer used in a millimeter-wave band and a microwave band capable of achieving loss reduction, a radar module, and a communication apparatus incorporating the mixer and having high efficiency. The mixer includes two electrodes formed on one main surface of a dielectric substrate and another electrode formed on another main surface thereof such that non-electrode portions on both main surfaces are opposed to each other via the dielectric substrate. Additionally, a diode is connected bridging a slit between the two electrodes on one main surface to constitute a circuit board. The circuit board and a dielectric strip are arranged between upper and lower conductive plates.

22 Claims, 8 Drawing Sheets

MIXER, RADAR MODULE, AND COMMUNICATION APPARATUS INCORPORATING THE SAME

BACKGROUND OF THE INVENTION

1. Field of the Invention

The present invention relates to mixers used in a millimeter wave band and a microwave band, radar modules, and communication apparatus incorporating the same.

2. Description of the Related Art

As a conventional mixer, Japanese Unexamined Patent Application Publication No. 10-75109 describes a mixer having a structure in which a diode is mounted in a non-radiative dielectric line (NRD guide).

In the above structure, a dielectric strip and a circuit board are arranged between two substantially parallel conductive plates to form a dielectric line. The conductive plates and conductive patterns on the circuit board constitute suspended lines. Additionally, the conductive patterns of the suspended lines are disposed in a direction crossing substantially perpendicularly to the dielectric strip, and also there are arranged filter circuits coupled with the dielectric line to block signals propagating through the suspended lines at at least two parts of the conductive patterns of the suspended lines sandwiching the dielectric strip so that a resonant circuit is provided. A diode is mounted in series to the conductive patterns inside the resonant circuit.

However, between the filter circuits composed of stubs of the suspended lines, a signal does not necessarily produce resonance. Thus, high frequency energy leaks from the filter circuits composed of the stubs and the like. This causes loss. In addition, due to the suspended lines having a low Q, the entire loss increases.

SUMMARY OF THE INVENTION

Accordingly, it is an object of the present invention to provide a mixer capable of achieving loss reduction, a radar module, and a communication apparatus incorporating the mixer and having high efficiency.

According to a first aspect of the invention, there is provided a mixer including a dielectric substrate, electrodes having apertures, the electrodes being formed on both main surfaces of the dielectric substrate such that the apertures are opposed to each other via the dielectric substrate, two conductive plates arranged substantially in parallel, the dielectric substrate being disposed between the conductive plates to constitute a planar TE-mode dielectric resonator, a slit formed between the electrodes on a main surface of the dielectric substrate to be continuous with one of the mutually opposing electrode apertures, and a diode connected manner bridging the slit.

With this arrangement, an input signal is received by the planar TE-mode dielectric resonator and applied to the diode bridging the slit. Accordingly, a mixing signal is extracted from the electrodes to which both ends of the diode are connected.

According to a second aspect of the invention, there is provided a single balanced mixer including a dielectric substrate, electrodes having apertures, the electrodes being formed on both main surfaces of the dielectric substrate such that the apertures are opposed to each other via the dielectric substrate, two conductive plates arranged substantially in parallel, the dielectric substrate being disposed between the conductive plates to constitute a planar TE-mode dielectric resonator, slits formed on both main surfaces of the dielectric substrate and opposed to each other via the dielectric substrate to be continuous with the electrode apertures, and diodes connected bridging the slits. With this arrangement, the single balanced mixer using the two diodes can be formed.

In addition, the mixer according to one of the first and second aspects may further include electrode separating portions formed to separate the electrodes to which both terminals of at least one of the diodes are connected, so that a direct current does not flow through the electrodes. With this arrangement, since a bias voltage can be applied to the at least one of the diodes from an external power source and thereby the diode can be driven at an optimum driving point, loss in the mixer can be reduced.

In addition, each of the electrode separating portions may be formed at a position where the intensity of an electric field is high in the planar TE-mode dielectric resonator. With this arrangement, the effect of reducing conductive loss can be enhanced.

In addition, the electrode apertures may be rectangular-shaped, and therefore the dielectric resonator may be a rectangular planar TE-mode dielectric resonator. With this arrangement, the formation of electrode patterns can be facilitated. Furthermore, a dielectric resonator having a high Q, which is capable of suppressing the occurrence of a spurious mode, can be formed on the dielectric substrate having a limited area.

In addition, the mixer of the invention may further include a dielectric strip arranged between the two conductive plates to form a dielectric line, which is coupled with the TE-mode dielectric resonator and is used as a signal-input line. This arrangement enables the easy formation of a mixer incorporated in an apparatus using a dielectric line as a transmission line.

According to a third aspect of the invention, there is provided a radar module including the mixer of the invention. The mixer is disposed in a circuit section mixing a received signal with a local signal. With this arrangement, the radar module can obtain high efficiency to improve detection capabilities.

According to a fourth aspect of the invention, there is provided a communication apparatus including the mixer of the invention. The mixer is disposed in a circuit section mixing one of a received signal and a transmitted signal with a local signal. With this arrangement, while reducing loss, frequency conversion can be performed to obtain high sensitivity.

Other features and advantages of the present invention will become apparent from the following description of the invention which refers to the accompanying drawings.

BRIEF DESCRIPTION OF THE DRAWING(S)

DETAILED DESCRIPTION OF EMBODIMENTS OF THE INVENTION

Figure 1A:
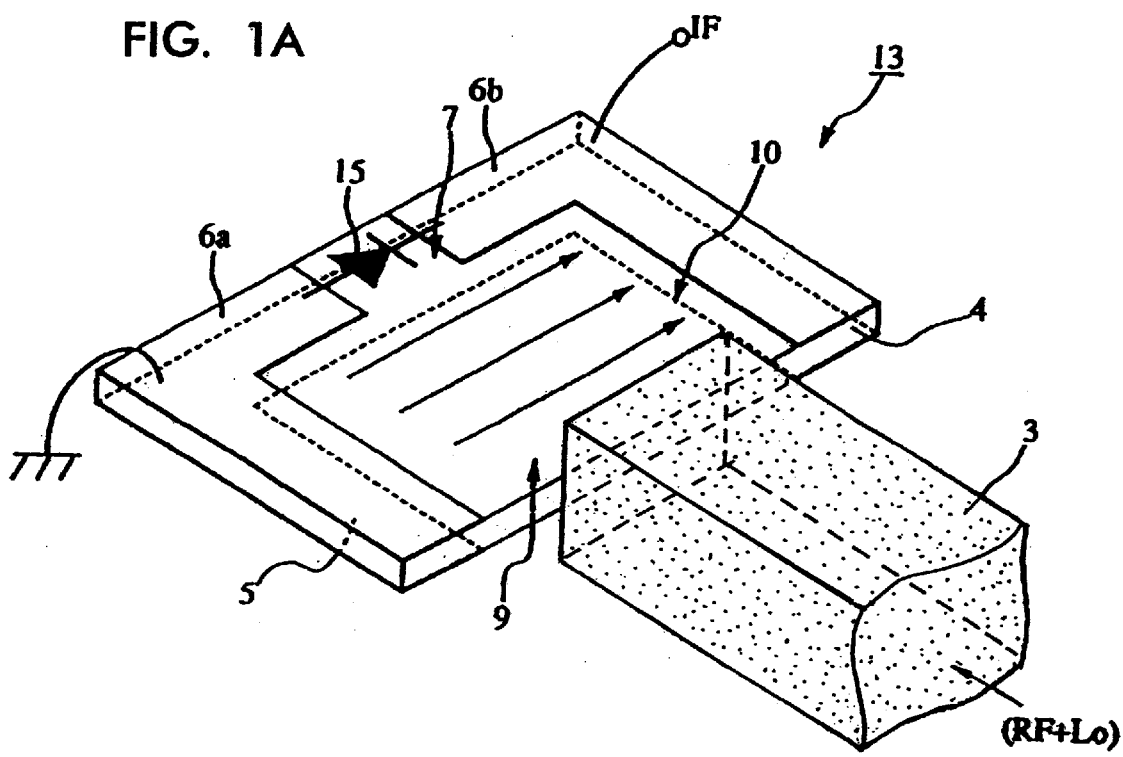
FIGS. 1A and 1B show a perspective view and a section illustrating the main part of a mixer according to a first embodiment of the present invention.
Figure 1B:
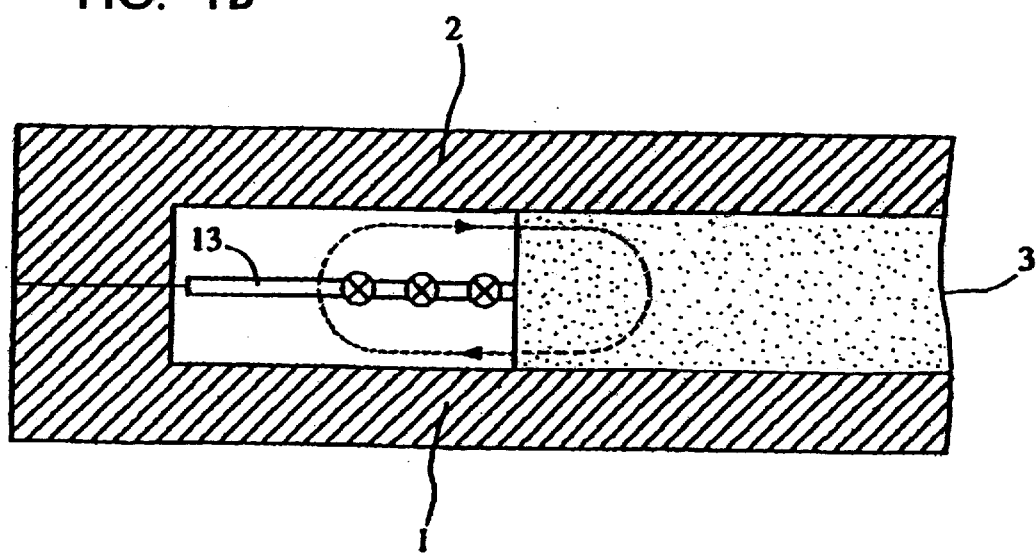

FIGS. 1A and 1B show the structure of a mixer according a first embodiment of the present invention.

FIG. 1A is a perspective view of the main part of the mixer when upper and lower conductive plates are removed. FIG. 1B is a section of the main part thereof. In these figures, reference numeral 4 denotes a rectangular planar dielectric substrate. An electrode 5 is formed on the lower surface of the substrate 4 and electrodes 6a and 6b are formed on the upper surface thereof. The electrode 5 and the electrodes 6a and 6b are arranged such that electrode apertures 9 and 10 are opposed to each other via the dielectric substrate 4. The part of the dielectric substrate sandwiched between the mutually opposing electrode apertures 9 and 10 serves as a rectangular planar TE-mode dielectric resonator.

In addition, a slit 7 continuous with the electrode aperture 10 is formed on the upper surface of the dielectric substrate 4. A mixer diode 15 such as a Schottky barrier diode is connected in a manner bridging the slit 7.

In each of FIGS. 1A and 1B, reference numeral 3 denotes a dielectric strip. The dielectric strip 3 is arranged between conductive plates 1 and 2 shown in FIG. 1B to form a dielectric line (NRD guide) comprising the conductive plates 1 and 2 and the dielectric strip 3. In addition, the electrode 5 is formed on the lower main surface of the dielectric substrate 4 and the electrodes 6a and 6b are formed on the upper main surface thereof. A circuit board 13 includes the dielectric substrate 4 having these electrodes formed thereon and the diode 15 mounted thereon. The circuit board 13 is arranged between the upper and lower conductive plates 1 and 2 making parallel conductive planes. The rectangular planar TE-mode dielectric resonator composed of the electrode apertures 9 and 10 is arranged near an end face of the dielectric strip 3.

With this arrangement, the LSM01-mode electric and magnetic fields of the dielectric line propagating through the dielectric strip 3 are coupled with the rectangular planar TE-mode dielectric resonator. In FIG. 1B, a broken line indicates the distribution of the magnetic field and the symbol x indicates the distribution of the electric field. In addition, in FIG. 1A, arrows shown in the rectangular planar TE-mode dielectric resonator indicate the electric field distribution of the TE-mode dielectric resonator.

When a signal obtained by mixing a received signal RF with a local signal Lo is input via the dielectric line, a (RF+Lo) voltage signal is induced between the electrodes 6a and 6b to be applied across the diode 15. As a result, an intermediate frequency (IF) signal is generated as a signal induced by the nonlinearity of the diode. For example, when the electrode 6a connected to the anode of the diode 15 is grounded, the IF signal can be obtained from the electrode 6b connected to the cathode thereof. In this manner, a single mixer can be formed.

A circuit for supplying a bias voltage to the diode 15 and obtaining an IF signal is disposed on or outside the circuit board 13.

In FIG. 1B, upper and lower spaces sandwiched by the upper and lower conductive plates 1 and 2 and the electrodes 5, 6a and 6b on the lower and upper surfaces of the dielectric substrate 13 serve as blocking areas at a used frequency. As a result, energy entering the rectangular planar TE-mode dielectric resonator hardly leaks outside and thereby loss reduction can be achieved.

Figure 2A:
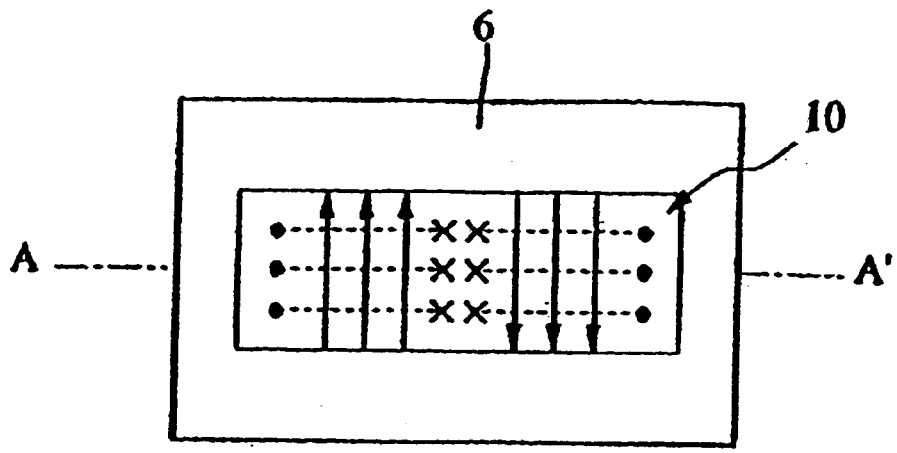
FIGS. 2A and 2B illustrate an example of electromagnetic field distributions in a rectangular planar TE-mode dielectric resonator.
Figure 2B:
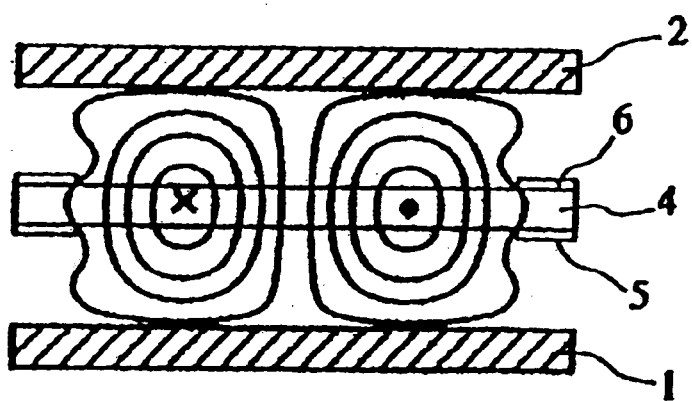

FIGS. 2A and 2B show electromagnetic distributions of the rectangular planar TE-mode dielectric resonator. FIG. 2A is a top view of the dielectric resonator when the conductive plates are removed and FIG. 2B is a section of the resonator taken along the line A–A' shown in FIG. 2A. Reference numerals shown in FIGS. 2A and 2B correspond to the numerals shown in FIGS. 1A and 1B. In these figures, solid lines indicate electric flux lines and broken lines indicate magnetic flux lines to illustrate the distributions of electric and magnetic fields. In this embodiment, the electrode aperture 10 is extended in a direction perpendicular to the direction of the electric field along a surface of the dielectric substrate to use the second harmonic (one wavelength) resonant mode of a TE10 mode, that is, a TE20 mode.

The planar TE-mode dielectric resonator has the following characteristics.

(1) The volume of the TE-mode dielectric resonator can be reduced to be 1/10 of the volume of a TE01-d mode dielectric resonator or less than that.

(2) For example, the Qo is approximately 1000 at 30 GHz, and therefore loss reduction is achieved.

(3) With the use of photolithography, fine electrode patterns with high dimensional accuracy can be formed on a dielectric substrate, thereby enhancing productivity and characteristic reproducibility.

(4) Since the electric and magnetic fields can be efficiently trapped, the resonator is suitable for integration.

Particularly, when the electrode apertures are rectangular-shaped so that the dielectric resonator serves as a rectangular planar TE-mode dielectric resonator, the formation of the electrode patterns can be facilitated. Furthermore, a dielectric resonator capable of having a high Q and suppressing the occurrence of a spurious mode is formed on the dielectric substrate having a limited area.

Therefore, by using the above dielectric resonator, the mixer of the invention can be made compact at low cost and can achieve loss reduction.

Next, referring to FIGS. 3A to 3D to FIG. 5, a description will be given of the coupling between the dielectric resonator and the dielectric line.

Figure 3A:
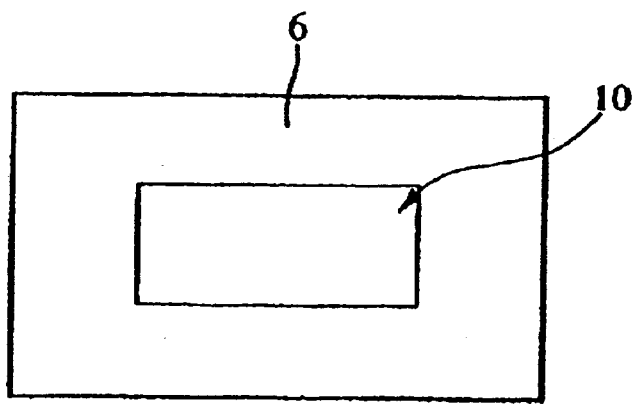
FIGS. 3A and 3B illustrate a plan view of a rectangular planar TE-mode dielectric resonator with both ends short-circuited and an example of magnetic distribution in the resonator.
Figure 3B:
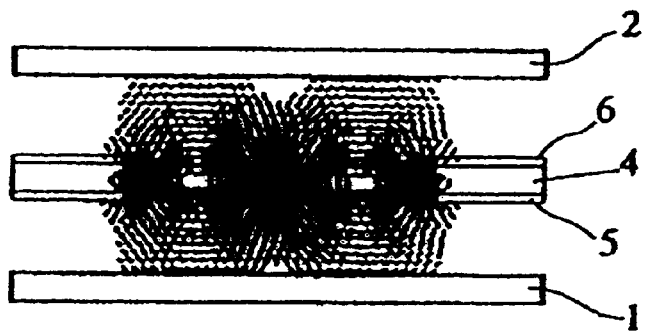
Figure 3C:
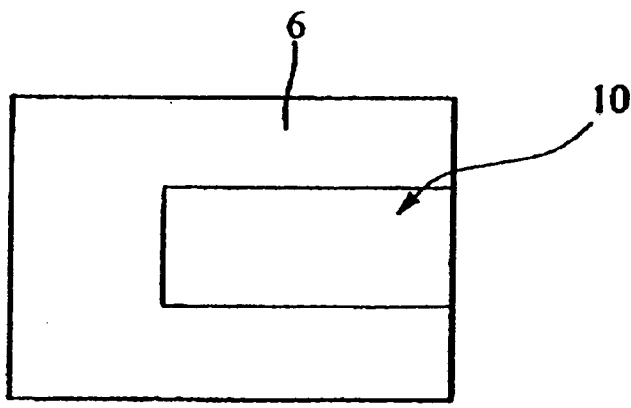
FIGS. 3C and 3D illustrate a plan view of a rectangular planar TE-mode dielectric resonator with one end short-circuited and an example of magnetic distribution in the resonator.
Figure 3D:
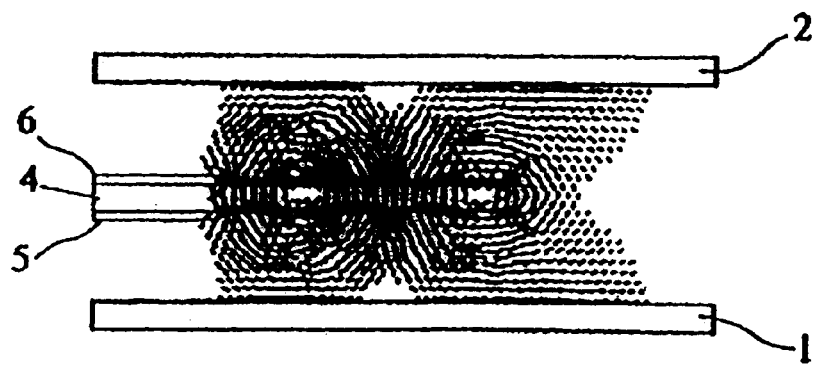

FIG. 3A shows a plan view of a rectangular planar TE-mode dielectric resonator formed like the resonator shown in FIGS. 2A and 2B, and FIG. 3B shows a magnetic field distribution thereof obtained by a finite-element method (FEM) analysis. Similarly, FIG. 3C shows a plan view of a rectangular planar TE-mode dielectric resonator in which one end of the electrode aperture 10 is open-circuited and FIG. 3D shows a magnetic field distribution obtained by the same method.

As mentioned above, when one end of the electrode aperture is open-circuited, electric and magnetic fields expand laterally from the open-circuited part, that is, in a direction away from the dielectric substrate. As a result, by arranging the dielectric strip close to the open-circuited part, the coupling between the dielectric line and the rectangular planar TE-mode dielectric resonator can be easily strengthened and thereby broadband characteristics can be obtained.

Figure 4:
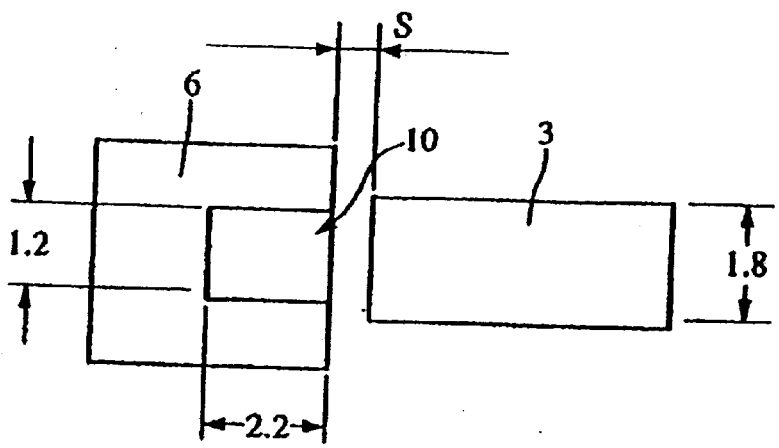
FIG. 4 illustrates the positional relationship between the rectangular planar TE-mode dielectric resonator and a dielectric strip.
Figure 5:
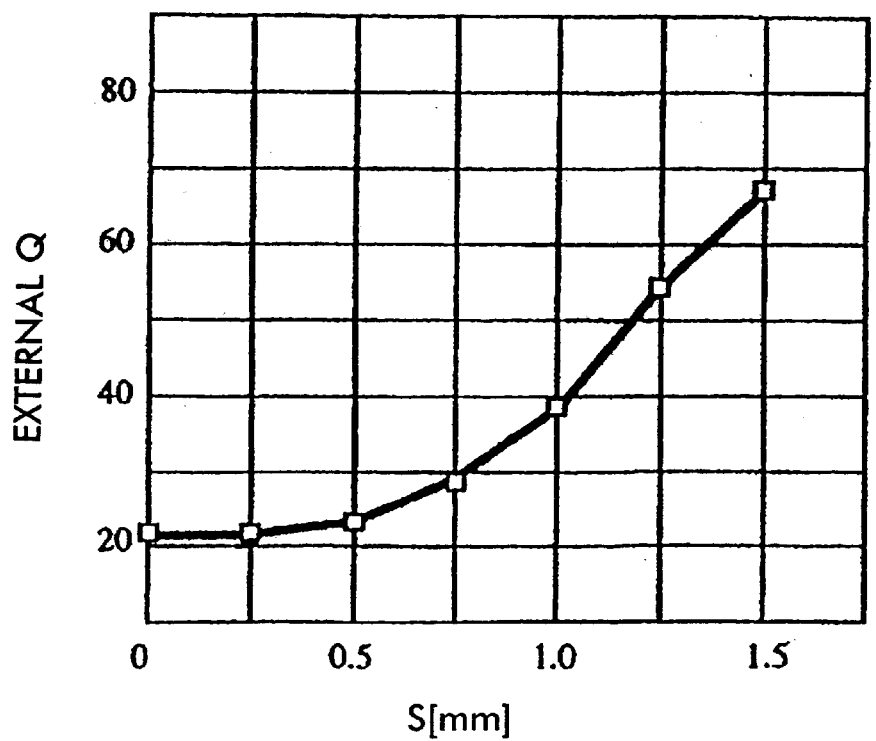
FIG. 5 is a graph illustrating the correlation between an external Q and a space between the rectangular planar TE-mode dielectric resonator and the dielectric strip.

FIG. 4 illustrates the dimensions of the dielectric resonator and the dielectric strip and the positional relationship between both of them. In this figure, a unit of length is millimeters (mm). FIG. 5 is a graph showing changes in an external Q (Qe) obtained by the three dimensional FEM (HFSS) when the space S between the dielectric substrate and the dielectric strip shown in FIG. 4 is changed.

In this case, for example, in order to obtain a required external Q of 27.6, the space S may be set to be 0.68 mm.

As shown in FIG. 5, even when the space S is approximately 1 mm, the external Q remains a small value of approximately 20. That is, even though the relative positions between the dielectric substrate and the dielectric strip deviate to some extent, the dielectric resonator can be steadily and strongly coupled with the dielectric line.

Figure 6A:
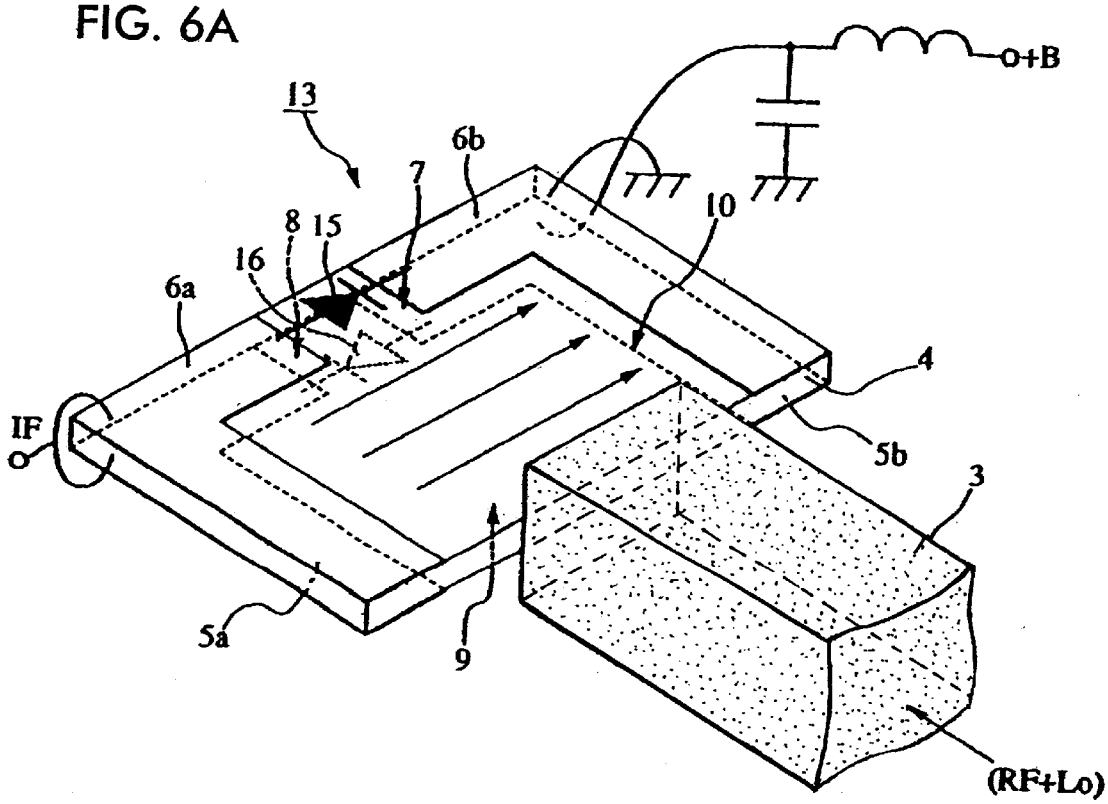
FIGS. 6A to 6C show a perspective view and circuit diagrams of the main part of a mixer according to a second embodiment of the present invention.
Figure 6B:
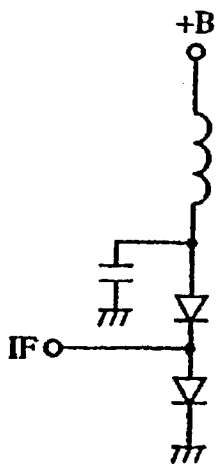
Figure 6C:
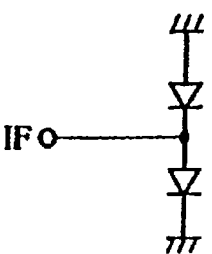

Next, each of FIGS. 6A to 6C illustrates a mixer according to a second embodiment of the invention. The structure of the mixer shown in FIG. 6A corresponds to the structure of the mixer shown in FIG. 1A. Unlike the mixer according to the first embodiment, in the second embodiment, as shown in FIGS. 6A to 6C, electrodes 5a and 5b are formed on the lower surface of a dielectric substrate 4 in a manner opposing electrodes 6a and 6b on the upper surface thereof. Additionally, a diode 16 is connected in a part bridging a slit 8 between the electrodes 5a and 5b. The direction of the diode 16 is opposed to the direction of a diode 15 bridging a narrow slit 7 between the electrodes 6a and 6b on the upper surface of the dielectric substrate 4. The electrodes 5b and 6b are, for example, used for grounding or applying a bias voltage to obtain an IF signal from the electrodes 5a and 6a. The other parts in this embodiment are the same as those shown in the first embodiment.

In FIG. 6B, the electrode 6b is grounded and a bias voltage +B is applied to the electrode 5b via a filter comprising an inductor and a capacitor.

In FIG. 6C, the electrodes 5b and 6b are both grounded to obtain a bias of zero.

In this manner, signals having mutually reversed phases are applied to the two diodes to extract an addition signal, so that a single balanced mixer is formed.

Figure 7:
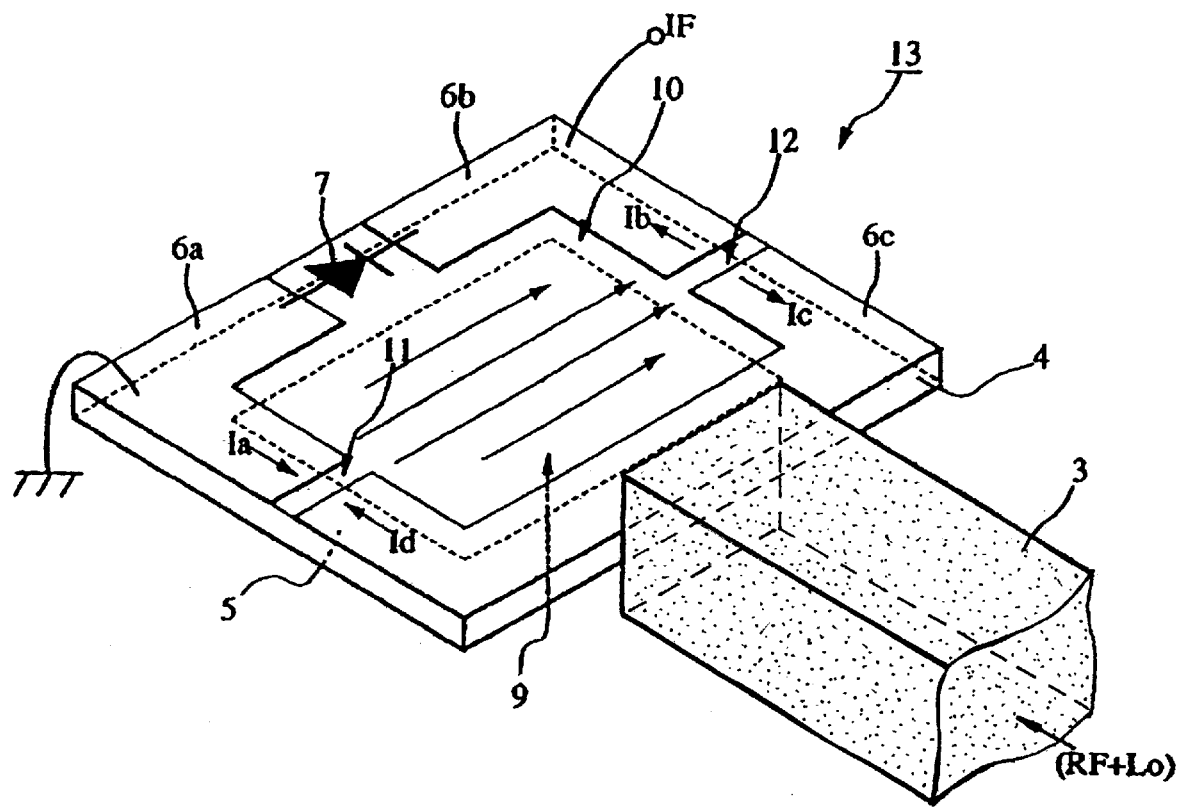
FIG. 7 shows a perspective view of the main part of a mixer according to a third embodiment of the present invention.

Referring to FIG. 7, a description will be given of a mixer according to a third embodiment of the invention.

FIG. 7 also shows a part corresponding to the part shown in FIG. 1A in the first embodiment. Each of the first and second embodiments uses the rectangular planar TE-mode dielectric resonator in which one end of each electrode is open-circuited and the open-circuited electrode portions of the dielectric resonator are positioned near the end of the dielectric strip 3. However, the embodiment shown in FIG. 7 uses the rectangular planar TE-mode dielectric resonator in which both ends of the electrodes are short-circuited, as shown in FIGS. 3A and 3B. With the use of the resonator having the electrodes with both ends short-circuited, as compared with the resonator having the electrodes with one end open-circuited, a mixer having a higher unloaded Q and lower loss can be formed. However, since the strength of coupling between the dielectric resonator and the dielectric line reduces, the mixer has narrow band characteristics.

In the rectangular planar TE10-mode dielectric resonator formed on the dielectric substrate 4 shown in FIG. 7, electric flux lines are shown by arrows in the figure. The intensity of the electric field is the greatest near the centers of the electrode apertures. In addition, resonant currents Ia, Ib, Ic, and Id flowing through the electrodes 6a, 6b, and 6c, and the edges of the electrode 5 bordering with the electrode aperture 10 are the smallest at places corresponding to the position in which the electric-field intensity is the greatest. Thus, even when electrode separating portions 11 and 12 are formed at the positions, there is little influence on the characteristics of the resonator.

When the electrode separating portions 11 and 12 are formed, the anode and cathode of the mixer diode can be isolated such that a direct current does not flow through the electrodes. Thus, since a bias voltage can be supplied from the outside, the diode can be used under an optimum driving condition.

The electrode on the lower surface of the dielectric substrate 4 may be arranged surface-symmetrically to the electrodes 6a, 6b, and 6c via the dielectric substrate 4. However, as shown in FIG. 7, the electrode 5 may have no electrode separating portions formed at positions opposing the electrode separating portions 11 and 12.

Figure 8:
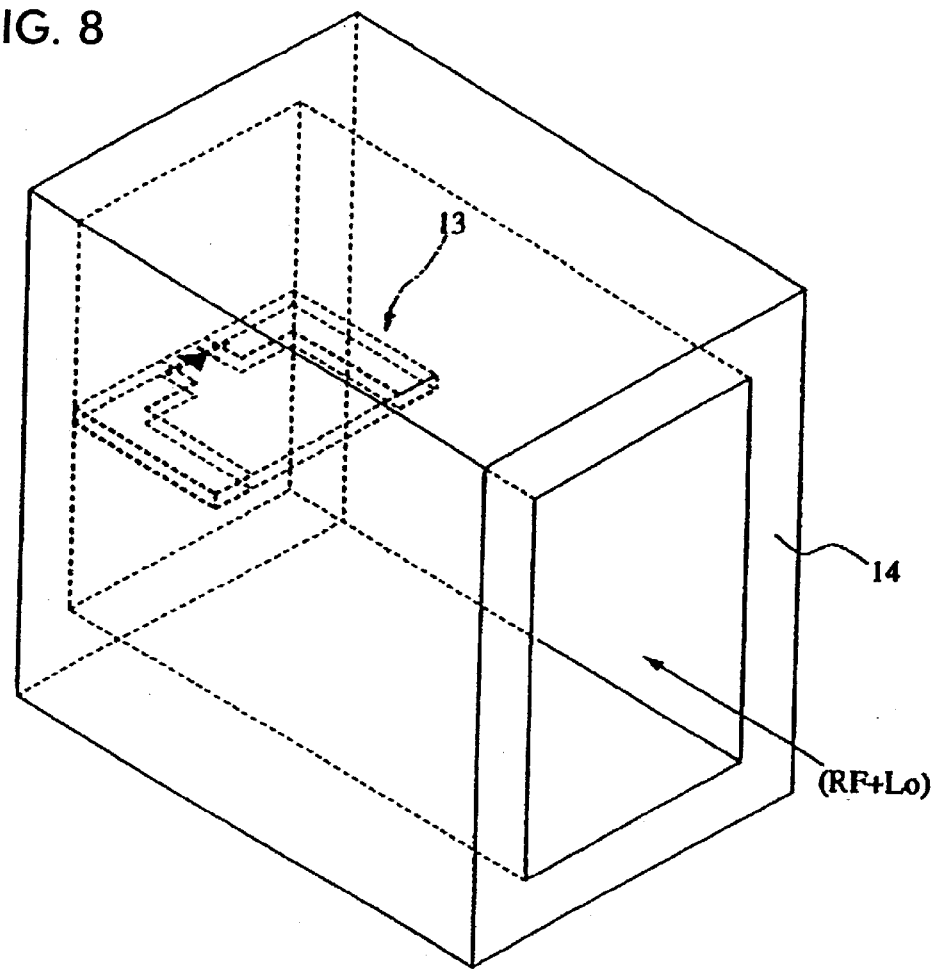
FIG. 8 shows a perspective view of the main part of a mixer according to a fourth embodiment of the present invention.

Referring to FIG. 8, a description will be given of a mixer according to a fourth embodiment of the invention.

Although each of the first to third embodiments uses the dielectric line as a signal-input line, the mixer shown in FIG. 8 uses a waveguide as a signal-input line. Specifically, in FIG. 8, reference numeral 14 denotes a rectangular waveguide. The circuit board 13 shown in one of FIGS. 1, 6, and 7 is arranged inside the rectangular waveguide. In this arrangement, the electromagnetic field of a TE10 mode wave propagating through the waveguide couples with the electromagnetic field of a rectangular planar TE-mode dielectric resonator formed on the circuit board 13. The mixer of the fourth embodiment is easily suitable to an apparatus using a waveguide as a transmission line.

Figure 9:
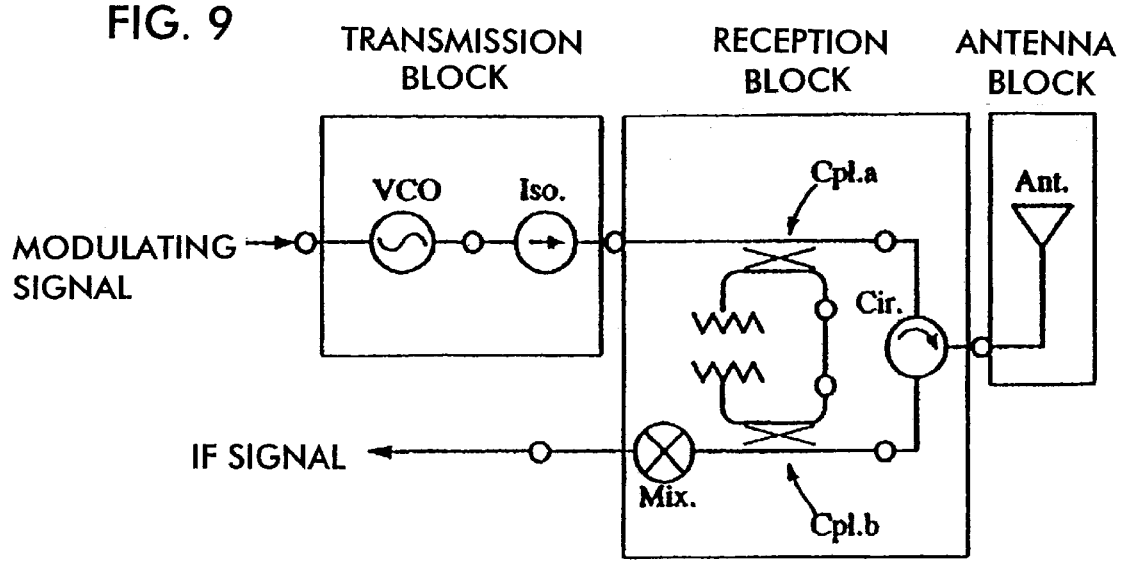
FIG. 9 shows a block diagram of a radar module according to a fifth embodiment of the present invention.

Referring now to FIG. 9, a description will be given of a radar module according to a fifth embodiment of the invention.

In FIG. 9, reference character VCO denotes a voltage-controlled oscillator using a Gunn diode and a varactor diode and reference character Iso. denotes an isolator for preventing a reflected signal from returning to the VCO. Reference character Cp1.a denotes a directional coupler comprising an NRD guide for obtaining some of the transmitted signals as local signals. Reference character Cir. denotes a circulator for sending a transmitted signal to a primary radiator of an antenna Ant. and sending a received signal to a mixer Mix. Reference character Cp1.b denotes a directional coupler comprising an NRD guide for mixing the received signal with the local signal and sending the mixed signals to the mixer Mix. The mixer Mix. generates a frequency signal obtained from the mixture of the received signal and the local signal and outputs the frequency signal as an intermediate frequency (IF) signal. Based on the relationship between a modulating signal of the VCO and the IF signal, a signal processing circuit, which is not shown in the figure, detects the distance between the radar module and a target object and the relative velocity.

The mixer Mix. shown in FIG. 9 is the mixer shown in one of the above embodiments. As a result, the radar module can have high efficiency and excellent detection capabilities.

Figure 10:
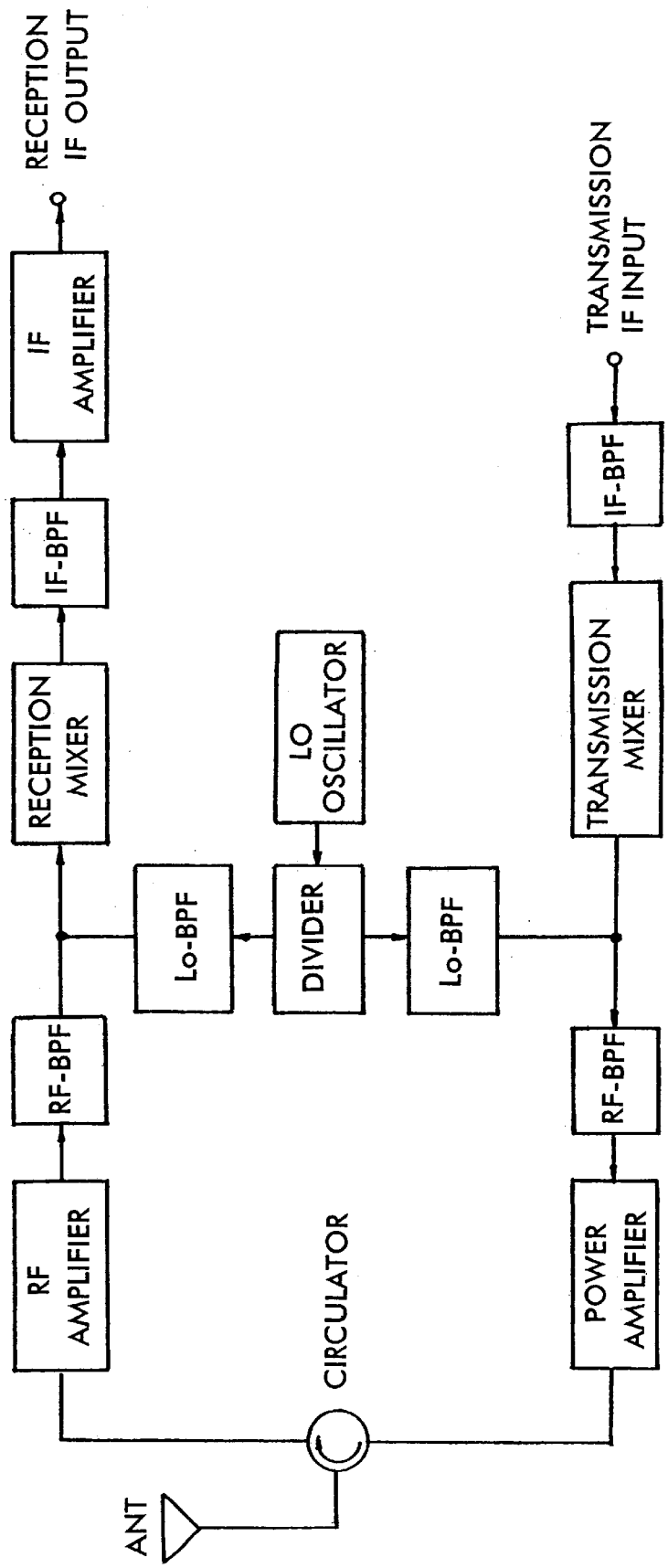
FIG. 10 shows a block diagram of a communication apparatus according to a sixth embodiment of the present invention.

Next, referring to FIG. 10, a description will be given of a communication apparatus according to a sixth embodiment of the invention.

Operations by respective blocks shown in FIG. 10 will be performed as follows. First, a received signal RF input from an antenna ANT is passed through a circulator to be amplified to a desired level by an RF amplifier. Unnecessary signals outside the amplified-signal receiving band are eliminated by a band pass filter RF-BPF. Then, a target received signal is input to a reception mixer. A divider performs power-division of a desired frequency signal sent from a Lo oscillator at a dividing ratio necessary for transmission and reception. The Lo signal with a desired electric power is input to each of a transmission mixer and a reception mixer through two band pass filters Lo-BPF. As the transmission and reception mixers, the mixer according to one of the above embodiments is used. Since the transmission and reception mixers use both an RF terminal and a Lo terminal, the band pass filters RF-BPF serve to prevent the Lo signal from leaking to the antenna.

IF signals equivalent to the difference between the RF signals and the Lo signals can be obtained from the reception mixer to which signals obtained by mixing the RF signals and the Lo signals are input. Of the IF signals, unnecessary signals are eliminated by the band pass filters IF-BPF, and only target IF signals are amplified to a desired level by an IF amplifier.

IF input signals on the transmission side are passed through the IF-BPF to be input to the transmission mixer. The transmission mixer mixes Lo signals with the IF signals to generate RF signals. Of the RF signals, unnecessary signals are eliminated by the RF-BPF and only the desired signals are amplified to a desired electric power level by a power amplifier.

The communication apparatus of the invention can be formed by adding necessary circuits such as a modulator and a demodulator to the transmission IF input section and the reception IF output section.

With the use of the mixer having the structure according to one of the above embodiments as the transmission and reception mixers, the mixer has low conversion-loss characteristics. Accordingly, the communication apparatus incorporating the mixer can have high sensitivity.

As described above, in the mixer according to the invention, the upper and lower spaces sandwiched by the upper and lower conductive plates and the electrodes on the upper and lower surfaces of the dielectric substrate serve as blocking areas at a used frequency. In addition, since energy entering the planar TE-mode dielectric resonator hardly leaks outside, there is no need for an RF trap circuit disposed in a conventional IF signal extraction circuit. Thus, there is no loss caused by the trap circuit, and thereby loss reduction can be achieved.

In addition, according to the invention, the dielectric strip is arranged between the two conductive plates to form a dielectric line. In addition, necessary components are mounted on the dielectric substrate having electrode patterns formed by photolithography or the like to constitute a circuit board. The mixer of the invention can be formed only by arranging the dielectric line and the circuit board such that a desired strength of coupling can be obtained between the conductive plates of the dielectric line. Accordingly, the entire mixer can be easily manufactured.

In addition, in this invention, the low loss mixer is disposed in the circuit section for mixing a received signal and a local signal. Thus, the radar module of the invention can have high efficiency and an excellent detection capability.

In addition, when the low loss mixer is disposed in the circuit section for mixing one of a received signal and a transmitted signal with a local signal, the communication apparatus of the invention can obtain high sensitivity.

While embodiments of the invention have been described above, it is to be understood that modifications and changes may be made without departing from the scope and sprit of the invention delineated by the following claims.

What is claimed is:

1. A mixer comprising:
   a dielectric substrate having first and second surfaces;
   an electrode having an aperture provided on each of the first and second surfaces of the dielectric substrate such that the aperture of the electrode on the first surface is opposed to the aperture of the electrode on the second surface;
   two conductive plates arranged substantially parallel to each other, the dielectric substrate being disposed between the conductive plates to form a planar TE-mode dielectric resonator;
   a slit formed in one of the electrodes on the first and second surface of the substrate so as to be continuous with the respective aperture of the electrode having the slit; and
   a diode bridging the slit.

2. The mixer of claim 1, further comprising electrode separating portions provided to separate the electrode to which both terminals of the diode are connected.

3. The mixer of claim 2, wherein each of the electrode separating portions is provided at a position where the intensity of an electric field is high in the planar TE-mode dielectric resonator.

4. The mixer of claim 1, wherein the electrode apertures are rectangular-shaped, and the dielectric resonator is a rectangular planar TE-mode dielectric resonator.

5. The mixer of claim 1, further comprising a dielectric strip arranged between the two conductive plates to form a dielectric line, the dielectric strip being coupled with the dielectric resonator.

6. A single balanced mixer comprising:
   a dielectric substrate having first and second surfaces;
   an electrode having an aperture provided on each of the first and second surfaces of the dielectric substrate such that the aperture of the electrode on the first surface is opposed to the aperture of the electrode on the second surface;
   two conductive plates arranged substantially parallel to each other, the dielectric substrate being disposed between the conductive plates to form a planar TE-mode dielectric resonator;
   respective slits formed in each of the electrodes on the first and second surfaces of the dielectric substrate, the respective slits being opposed to each other and continuous with the respective electrode apertures; and
   a respective diode bridging each slit.

7. The mixer of claim 6, further comprising electrode separating portions provided to separate the electrode to which both terminals of at least one of the respective diodes are connected.

8. The mixer of claim 7, wherein each of the electrode separating portions is formed at a position where the intensity of an electric field is high in the planar TE-mode dielectric resonator.

9. The mixer of claim 6, wherein the electrode apertures are rectangular-shaped, and the dielectric resonator is a rectangular planar TE-mode dielectric resonator.

10. The mixer of claim 6, further comprising a dielectric strip arranged between the two conductive plates to form a dielectric line, the dielectric strip being coupled with the dielectric resonator.

11. A radar module comprising:
a mixer which includes:
a dielectric substrate having first and second surfaces;
an electrode having an aperture provided on each of the first and second surfaces of the dielectric substrate such that the aperture of the electrode on the first surface is opposed to the aperture of the electrode on the second surface;
two conductive plates arranged substantially parallel to each other, the dielectric substrate being disposed between the conductive plates to form a planar TE-mode dielectric resonator;
a slit formed in one of the electrodes on the first and second surface of the substrate so as to be continuous with the aperture of the electrode having the slit; and
a diode bridging the slit;
the mixer being disposed in a circuit section mixing a received signal with a local signal.

12. A radar module comprising:
a mixer which includes:
a dielectric substrate having first and second surfaces;
an electrode having an aperture provided on each of the first and second surfaces of the dielectric substrate such that the aperture of the electrode on the first surface is opposed to the aperture of the electrode on the second surface;
two conductive plates arranged substantially parallel to each other, the dielectric substrate being disposed between the conductive plates to form a planar TE-mode dielectric resonator;
respective slits formed in each of the electrodes on the first and second surfaces of the dielectric substrate, the respective slits being opposed to each other and continuous with the respective electrode apertures; and
a respective diode bridging each slit;
the mixer being disposed in a circuit section mixing a received signal with a local signal.

13. A communication apparatus comprising:
a mixer which includes:
a dielectric substrate having first and second surfaces;
an electrode having an aperture provided on each of the first and second surfaces of the dielectric substrate such that the aperture of the electrode on the first surface is opposed to the aperture of the electrode on the second surface;
two conductive plates arranged substantially parallel to each other, the dielectric substrate being disposed between the conductive plates to form a planar TE-mode dielectric resonator;
a slit formed in one of the electrodes on the first and surface of the substrate so as to be continuous with one the aperture of the electrode having the slit; and
a diode bridging the slit;
the mixer being disposed in a circuit section mixing one of a received signal and a transmitted signal with a local signal.

14. A communication apparatus comprising:
a mixer which includes:
a dielectric substrate having first and second surfaces;
an electrode having an aperture provided on each of the first and second surfaces of the dielectric substrate such that the aperture of the electrode on the first surface is opposed to the aperture of the electrode on the second surface;
two conductive plates arranged substantially parallel to each other, the dielectric substrate being disposed between the conductive plates to form a planar TE-mode dielectric resonator;
respective slits formed in each of the electrodes on the first and second surfaces of the dielectric substrate, the respective slits being opposed to each other and continuous with the respective electrode apertures; and
a respective diode bridging each slit;
the mixer being disposed in a circuit section mixing one of a received signal and a transmitted signal with a local signal.

15. The mixer of claim 14, further comprising two conductive plates arranged substantially parallel to each other, the dielectric substrate being disposed between the conductive plates.

16. The mixer of claim 14, wherein each of the first and second electrodes have a slit.

17. The mixer of claim 16, wherein a diode bridges each slit.

18. The mixer of claim 17, wherein the diodes are arranged so as to be reversed with respect to each other.

19. A mixer comprising:
a dielectric substrate having a first surface and a second surface;
a first electrode provided on the first surface of the dielectric substrate, the first electrode having a first aperture;
a second electrode provided on the second surface of the dielectric substrate, the second electrode having a second aperture, the second electrode being arranged on the second surface of the dielectric substrate such that the first and second apertures are opposed to each other;
a slit formed in one of the first and second electrodes; and
a diode bridging the slit.

20. The mixer according to claim 19, wherein at least one of the first and second electrodes has one open end and one closed end.

21. The mixer according to claim 20, further comprising a dielectric strip positioned at the open end of the at least one of the first and second electrode having the open end and the closed end.

22. The mixer according to claim 19, wherein at least one of the first and second electrodes includes electrode separating portions provided to separate the electrode having the diode bridging the slit.

* * * * *